United States Patent
Codama et al.

(10) Patent No.: US 6,452,212 B1
(45) Date of Patent: Sep. 17, 2002

(54) SEMICONDUCTOR DEVICE AND METHOD FOR OPERATING THE SAME

(75) Inventors: Mitsufumi Codama; Kazushi Sugiura; Yukio Yamauchi; Naoya Sakamoto, all of Kanagawa; Michio Arai, Tokyo, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1205 days.

(21) Appl. No.: 08/934,088

(22) Filed: Sep. 19, 1997

Related U.S. Application Data

(63) Continuation of application No. 08/577,390, filed on Dec. 22, 1995, which is a continuation of application No. 08/328,411, filed on Oct. 25, 1994, now abandoned.

(30) Foreign Application Priority Data

Nov. 2, 1993 (JP) ................................................ 5-297492

(51) Int. Cl.[7] .............................................. H01L 29/76
(52) U.S. Cl. ...................................................... 257/66
(58) Field of Search .............................. 257/53, 66, 72, 257/252, 290, 291, 353, 501, 393

(56) References Cited

U.S. PATENT DOCUMENTS

| | | | | |
|---|---|---|---|---|
| 4,409,724 A | * | 10/1983 | Tasch et al. | 29/571 |
| 4,823,180 A | * | 4/1989 | Wieder et al. | 357/30 |
| 4,851,370 A | * | 7/1989 | Doklan et al. | 437/225 |
| 4,886,962 A | * | 12/1989 | Gofuku et al. | 257/290 |
| 5,262,654 A | | 11/1993 | Yamazaki | |
| 5,343,066 A | * | 8/1994 | Okamoto et al. | 257/393 |
| 5,365,079 A | * | 11/1994 | Kodaira et al. | 257/72 |

FOREIGN PATENT DOCUMENTS

| | | |
|---|---|---|
| JP | 63-260167 | 10/1988 |
| JP | 04-206969 | 7/1992 |
| JP | 04-233774 | 8/1992 |

* cited by examiner

*Primary Examiner*—Douglas A. Wille
(74) *Attorney, Agent, or Firm*—Eric J. Robinson; Robinson Intellectual Property Law Office PC

(57) ABSTRACT

A semiconductor device comprising an active layer made from a crystalline silicon formed on a substrate having an insulating surface; a gate insulating film formed on said active layer; and a source region and a drain region provided in contact with said active layer; wherein, said active layer generates photo carriers upon irradiation of a light, a part of the thus generated photo carriers having the opposite polarity with respect to that of the carriers flowing in the vicinity of the interface with the gate insulating film is temporarily accumulated within said active layer to change the resistance of the region of said active layer, and the light irradiated to said active layer is detected from the change in current flow between the source and the drain which occurs in accordance with the change in resistance in the region of said active region. The semiconductor device according to the present invention is particularly an image sensor device which amplifies an optical signal and which outputs it as an electric signal.

7 Claims, 8 Drawing Sheets

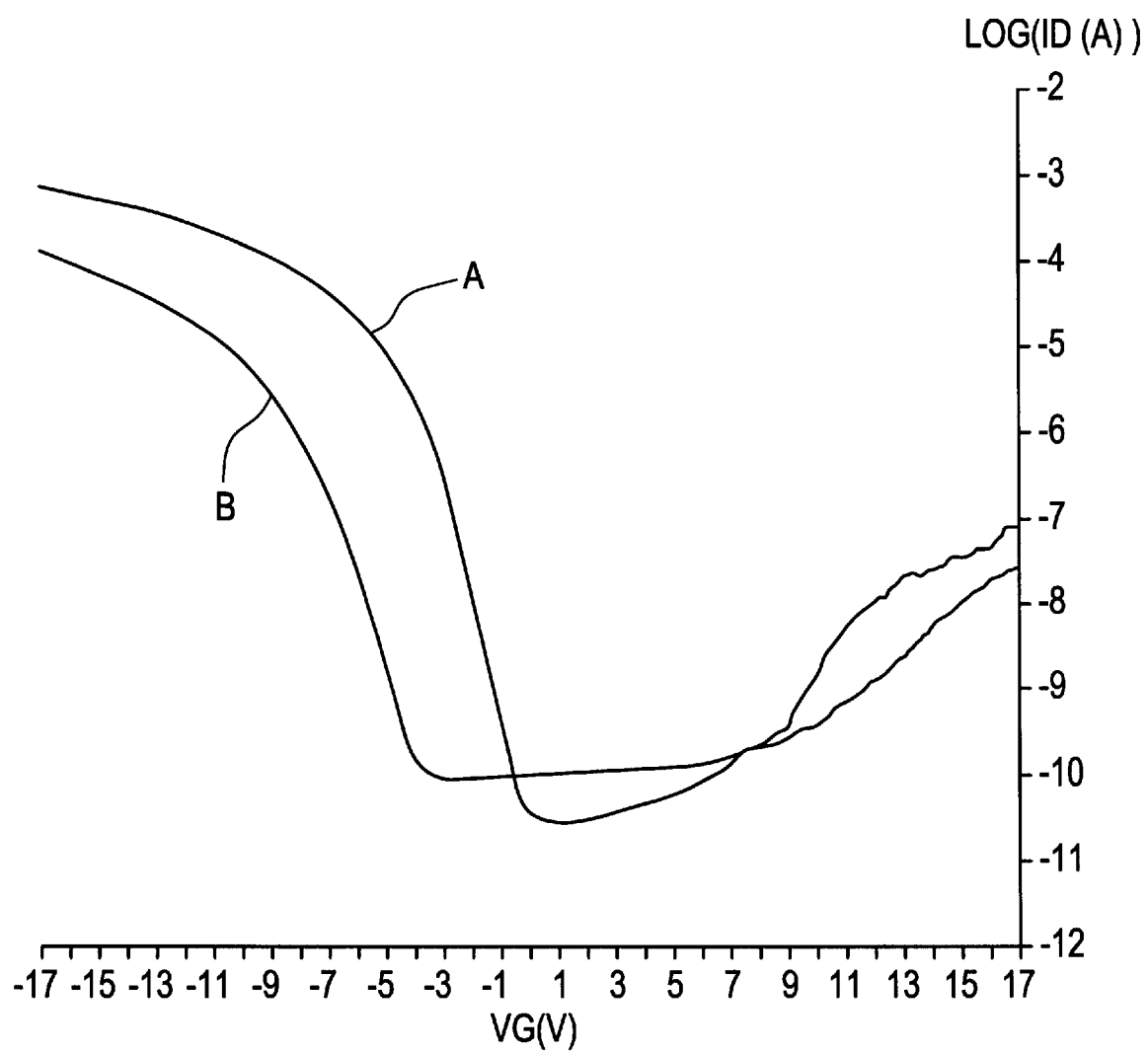

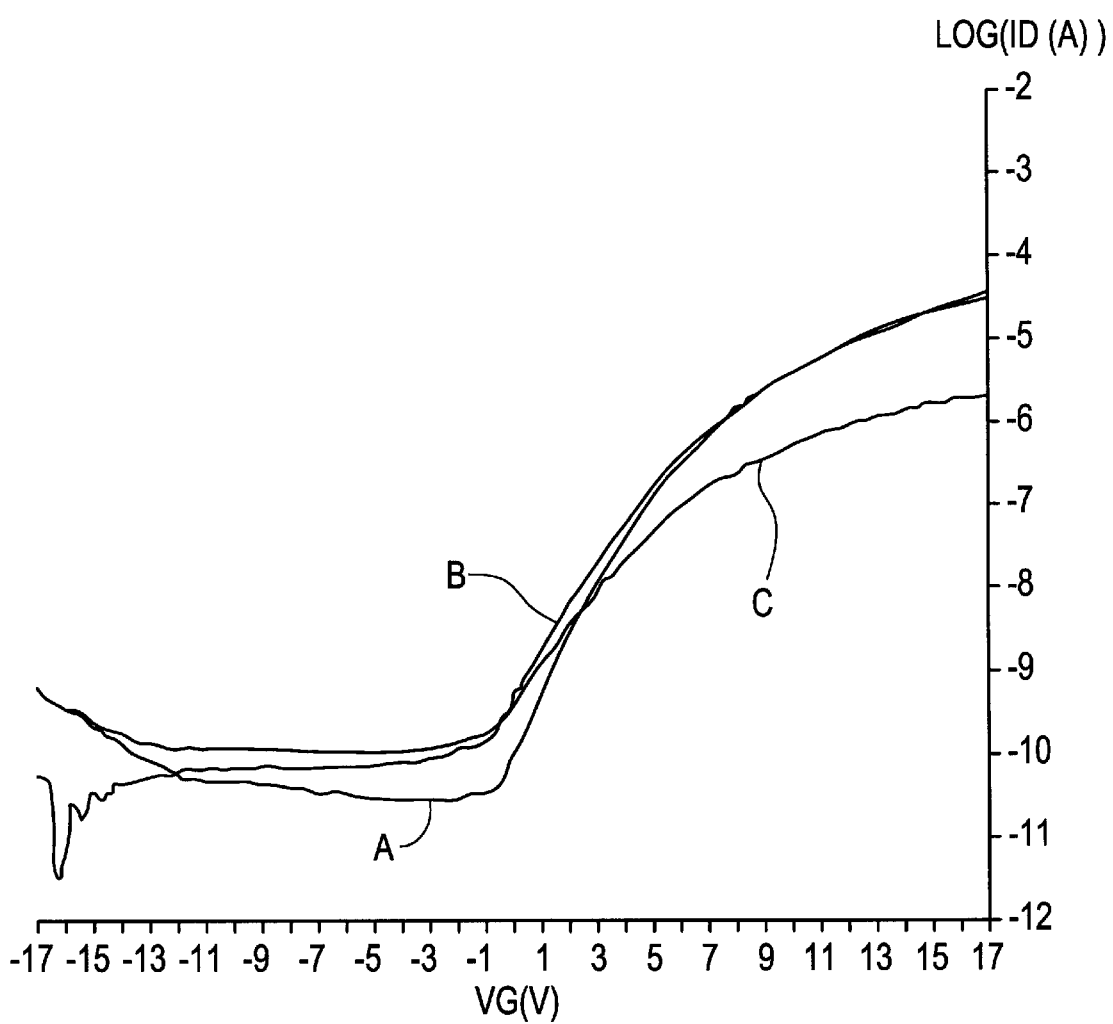

SEMICONDUCTOR DEVICE AND METHOD FOR OPERATING THE SAME

This application is a Continuation of Ser. No. 08/577,390, filed Dec. 22, 1995; which itself is a continuation of Ser. No. 08/328,411, filed Oct. 25, 1994, now abandoned.

BACKGROUND OF THE INVENTION

1. Industrial Field of Invention

The present invention relates to a semiconductor device which is capable of taking out an optical signal in the form of an electric signal. The semiconductor device according to the present invention is useful as a solid image pick-up device (also known as an "image sensor").

2. Prior Art

With the spread of facsimiles, more compact and lighter image sensors are demanded at a still lower cost. Image sensors used for facsimiles can be roughly classified into three types, i.e., a non-contact type, a contact type, and a complete contact type.

In non-contact type image sensors, the original manuscript is projected to a charge coupled device (CCD) through a reduction lens. The image sensors of this type are advantageous in that they can be readily fabricated by a well established LSI process using silicon wafers. Accordingly, they can be obtained at a low cost and with high productivity. However, on the other hand, the accompanying optics including the reduction lens and the like increases problems in the size and the weight of the entire sensor.

In contrast to the above non-contact type image sensors, those of the contact-type and the complete contact type are advantageous in that they can be fabricated into compact and light-weight devices. However, the production cost concerning the fabrication process, mounting, and assembling is disadvantageously high. Moreover, the image sensors of these types require the use of expensive components such as SELFOC (registered trade mark) lens arrays and thin glass sheets. Accordingly, the problem of costly production remains as a problem yet to be solved.

The contact-type image sensors utilized in facsimiles principally include those of multi-chip type comprising a plurality of MOSLSIs, and those of thin film type comprising optical sensor portions using thin film amorphous silicon and the like. At any rate, both of them use SELFOC lens arrays.

The image sensors of the multi-chip type can be obtained by a well established advanced technology based on the MOSLSIs fabrication process. Thus, it is believed that the image sensors of this type can provide a stable supply with a high product yield. However, because of the poor assembly precision, the packaged MOSLSI chips are not always uniform in characteristics.

In contrast to the image sensors of the multi-chip type, those of the thin film type can be readily formed in a large area because they can be fabricated by a thin film process on an insulating substrate made from a glass, a ceramics, and the like. Furthermore, reader chips for reading the original manuscript can be fabricated with the same length as the width of the original one. However, the chips of this type are disadvantageous in that they require a plurality of process steps, lower the product yield and hence increase the production cost.

Known photoelectric transfer elements include those of photo-conductor type and photo-diode type.

The photoelectric transfer elements of the photo-conductor type is made from a material whose resistance decreases upon receiving a light. Specifically mentioned as such a material include amorphous silicon. The change in resistance with the irradiation of light is read out as the change in electric current. In general, the photoelectric transfer elements of the photo-conductor type can afford a large flow of current and hence are resistant to noises. However, they suffer a poor optical response and are therefore not suitable for facsimiles in which high speed response is keenly demanded.

On the other hand, the photoelectric transfer elements of the photo-diode type produces a current signal at an intensity proportional to the intensity of light irradiated to the diode. More specifically, the carriers that are generated in the depletion layer by the light irradiated to the diode are swept with a reverse bias voltage. The elements of the photo-diode type quickly responds to light. However, the current flow in the photo-diode is so small that it is apt to be affected by noises.

Moreover, the photoelectric transfer elements of the photo-diode type above requires a plurality of complexed fabrication processes separately from fabricating a driver circuit for reading out the signal. The fabrication processes hence become complicated and includes a large number of steps. Hence, in general, the product yield tends to be lowered. Moreover, in case the driver circuit for reading out the signal is constructed by a separately added IC, since it requires a plurality of reader chips, it is difficult to lower the cost.

The aforementioned problems concerning image sensors can be overcome by a constitution satisfying the following requirements:

(1) a fabrication process composed of less process steps; the products can be fabricated at a high yield and hence at a low cost;

(2) a driver circuit for reading out the signal being assembled in the same substrate as that on which the photoelectric transfer element is provided; a plurality of external ICs can be hence excluded, and the sensor can be readily made in a large area at a reduced cost; additionally, a voluminous reduction optics is also omitted;

(3) a favorable optical response is assured, and is capable of high speed operation; and (4) an intense signal can be obtained without being influenced by a noise.

SUMMARY OF THE INVENTION

An object of the present invention is to provide a photoelectric transfer element satisfying the above-mentioned requirements in items (1) to (4).

The object of the present invention above can be accomplished in one aspect by a semiconductor device illustrated in FIG. 1. The semiconductor device comprises a substrate 1 made of an insulating material such as glass or quartz. The semiconductor device amplifies the light signal irradiated to the device to be outputted as an electric signal corresponding thereto.

Referring to FIG. 1, the semiconductor device comprises an insulating substrate 1 having thereon an insulating layer 2, a crystalline silicon active layer 4 which generates photo carriers and which provides the channel forming region, a gate insulating film 6, a gate electrode 7, an interlayer insulating film 8, interconnecting electrodes 9 and 10, and one-conductive type source and drain regions 3 and 5 provided in contact with the active layer.

A predetermined voltage is applied to the gate electrode 7. In case source and drain regions 3 and 5 are N-conductive, a positive voltage is applied. If source and drain regions 3 and 5 are P-conductive, a negative voltage is applied.

As illustrated in FIG. 1, the key in the semiconductor device according to the present invention is to establish a structure comprising a crystalline silicon layer 4 which generates the photo carriers with the insulating layer 2 and the gate insulating film 6 sandwiching the crystalline silicon layer. The carriers generated by the irradiation of light are essentially required to be thus confined in the crystalline silicon layer 4. That is, a part of the thus generated photo carriers having the opposite polarity with respect to that of the carriers flowing in the active layer in the vicinity of the interface with the gate insulating film is temporarily accumulated within the active layer to change resistance of the active layer.

The operation principle of the semiconductor device is described below with reference to the constitution shown in FIG. 1. A light irradiated to said active layer is detected from the change in current flow between the source and the drain which occurs in accordance with the change in the resistance of the active layer. The semiconductor device outputs the optical signal irradiated to the crystalline silicon active layer 4 as an electric signal current flown between the source and drain regions.

The description below refers to a semiconductor device comprising an N-conductive semiconductor for the source and drain regions 3 and 5. A positive voltage is applied to the gate electrode 7. And an appropriate voltage is assumed to be applied between the source and drain.

In the above state, a case in which a light is irradiated to the active layer 4 is considered. Referring to FIG. 1, carriers are generated by photo-excitation, and the electrons, which are negatively charged, are attracted to the positively charged side of gate electrode 7. The holes having the positive charge move reversely towards the side of insulating layer 2.

The region to which the electrons are concentrated is reversed by the positive voltage applied to the gate electrode. Thus is formed a channel region having a low resistance. Hence, the electrons attracted to the gate electrode side contribute to the current flowing between the source and drain regions 3 and 5.

The holes concentrated to the side of the insulating layer 2 can not dissipate into the substrate by diffusion because an insulating layer 2 is provided on the substrate. Considering a case of an ordinary IC fabricated on a silicon wafer, this concept of the present invention corresponds to a state in which a substrate bias is applied (FIG. 2).

Referring to a MIS (metal insulator semiconductor) transistor fabricated on the surface of a single crystal silicon wafer 21, a channel region 24 is provided between source and drain regions 23 and 25.

In a state at which a substrate bias is applied as shown in FIG. 2, the resistance of the channel 24 changes with the shift in threshold voltage. Thus, the resistance of the channel 24 can be changed by varying the applied substrate bias. On the other hand, in the constitution shown in FIG. 1, a similar effect can be obtained by changing the number (density) of holes concentrated to the side of the insulating layer 2 of the active layer 4.

Referring to the constitution illustrated in FIG. 1, the holes concentrated in the side of the insulating layer 2 are photo carriers generated by the irradiation of light. The density of the holes is determined by the wavelength and the quantity of light irradiated to the active layer 4. Thus, the resistance of the channel formed on the side of the gate insulating film 6 in the active layer 4 can be controlled by the light irradiated to the active layer 4.

It is confirmed by experimentation that a current change corresponding to about $10^4$ to $10^5$ times the photo carriers generated in the crystalline silicon active layer 4 by the light irradiated thereto can be output as a current flowing between the source and drain.

BRIEF DESCRIPTION OF THE DRAWINGS

FIG. 5 shows the voltage-current ($I_D$-$V_G$) characteristics of a semiconductor device according to an embodiment of the present invention;

FIG. 6 shows the current-voltage ($I_D$-$V_G$) characteristics of a semiconductor device according to another embodiment of the present invention;

DETAILED DESCRIPTION OF THE INVENTION

The present invention is described in further detail below referring to the preferred embodiments according to the present invention. It should be understood, however, that the present invention is not to be construed as being limited to the examples below.

An image sensor according to an embodiment of the present invention is described below. Firstly, by referring to FIGS. 3 and 4, the process for fabricating the device is described. FIGS. 3 and 4 show two driver circuit portions in the right hand side and an image sensor element portion in the left hand side. The image sensor element portion outputs an electric signal in accordance with the incident light. The driver circuit portion drives the image sensor element portion.

Figure 3A:
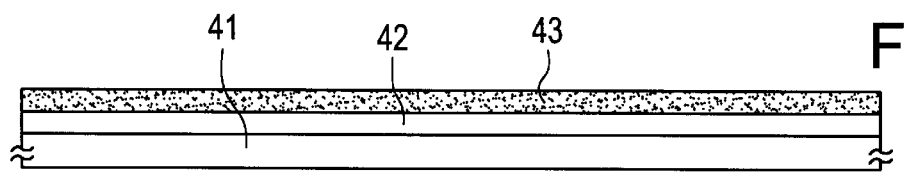
Figure 3B:
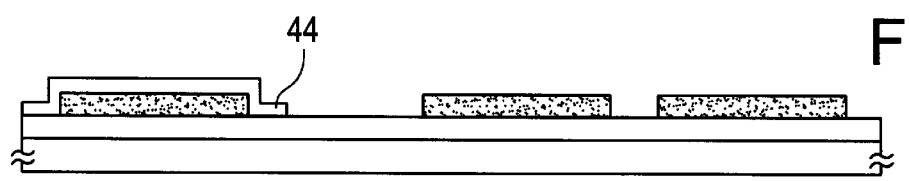
Figure 3C:
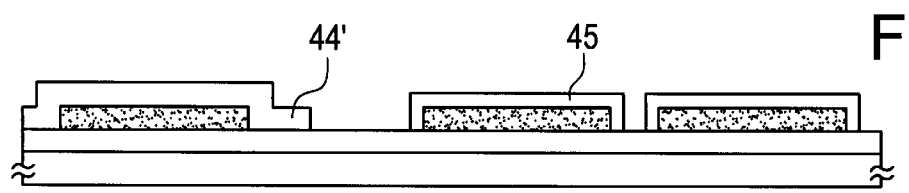
Figure 3D:
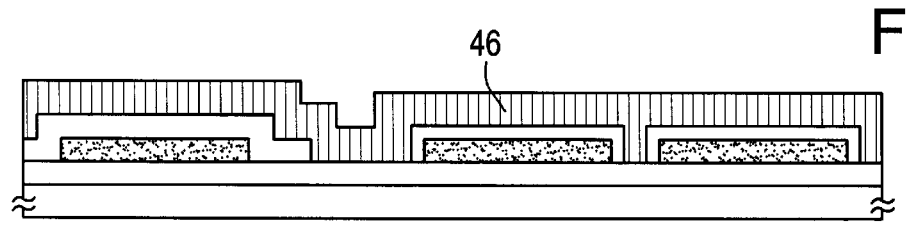
Figure 3E:
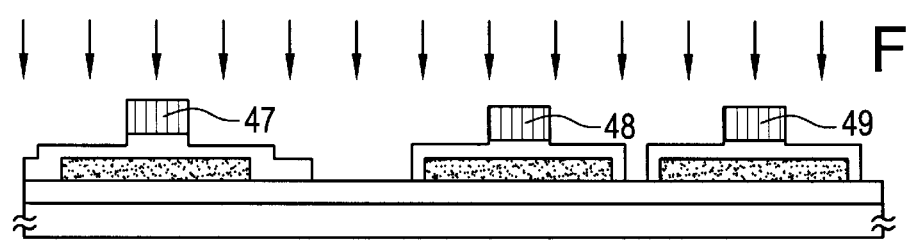
Figure 3F:
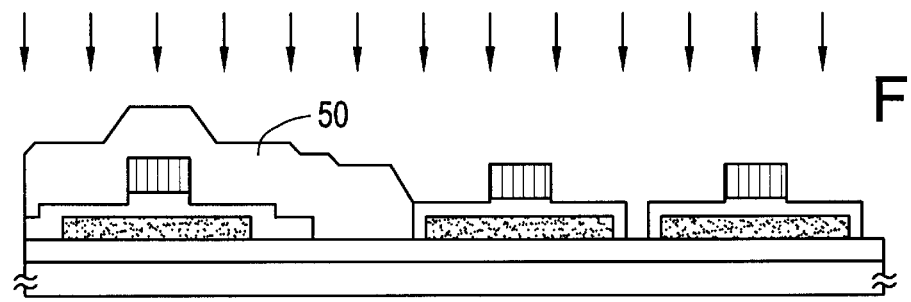
Figure 4A:
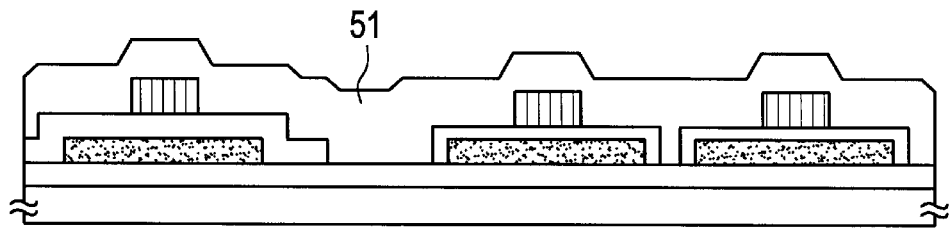
FIGS. 4 (A) to 4 (D) are a diagram showing sequential steps for fabricating a semiconductor device according to another embodiment of the present invention.
Figure 4B:
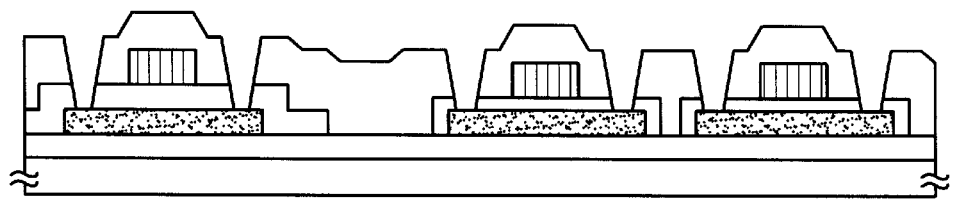
Figure 4C:
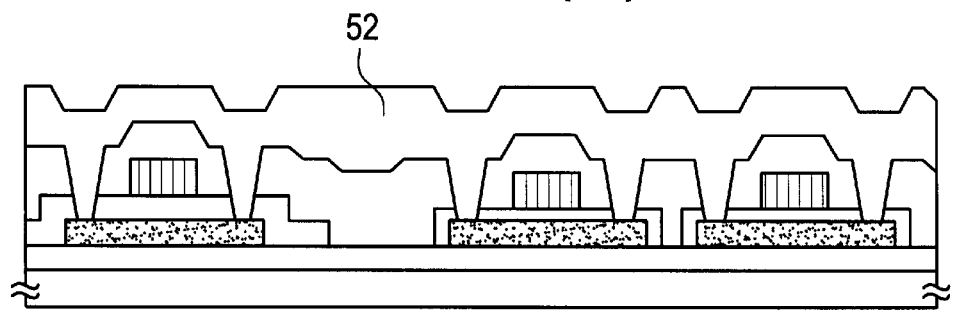
Figure 4D:
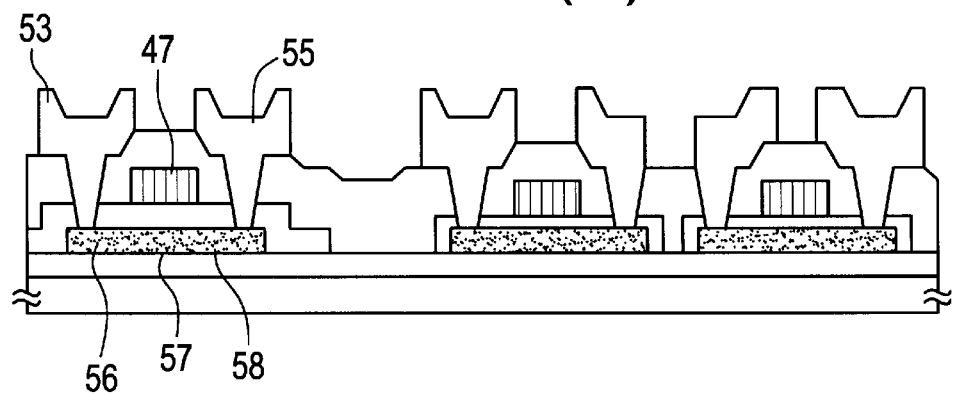

Referring to FIG. 3(A), a silicon oxide film 42 is deposited by means of LPCVD or sputtering to a thickness of 200 nm as an insulating underlayer on a quartz substrate 41. The silicon oxide film thus deposited corresponds to the insulating layer 2 illustrated in FIG. 1, which prevents the carriers from being dissipated into the substrate from the active silicon layer formed thereon.

An insulating material such as a glass can be used as the substrate. In case an insulating material is used as the substrate, the insulating underlayer can be omitted. However, the insulating underlayer is useful for preventing the diffusion of impurities into the device from the substrate side and for relaxing the stress between the substrate and the active silicon layer. However, an insulating underlayer must be deposited in case a semiconductor or a conductor is used as the substrate.

A silicon film 43 is deposited thereafter by plasma CVD to a thickness of 200 nm on the underlayer 42 provided on the quartz substrate. Thus, an amorphous silicon film 43 is deposited at a deposition rate of 6 nm/min at a reaction temperature of 200° C. under a reaction pressure of 5.3 Pa, and by applying an RF power of 35 W.

Figure 1:
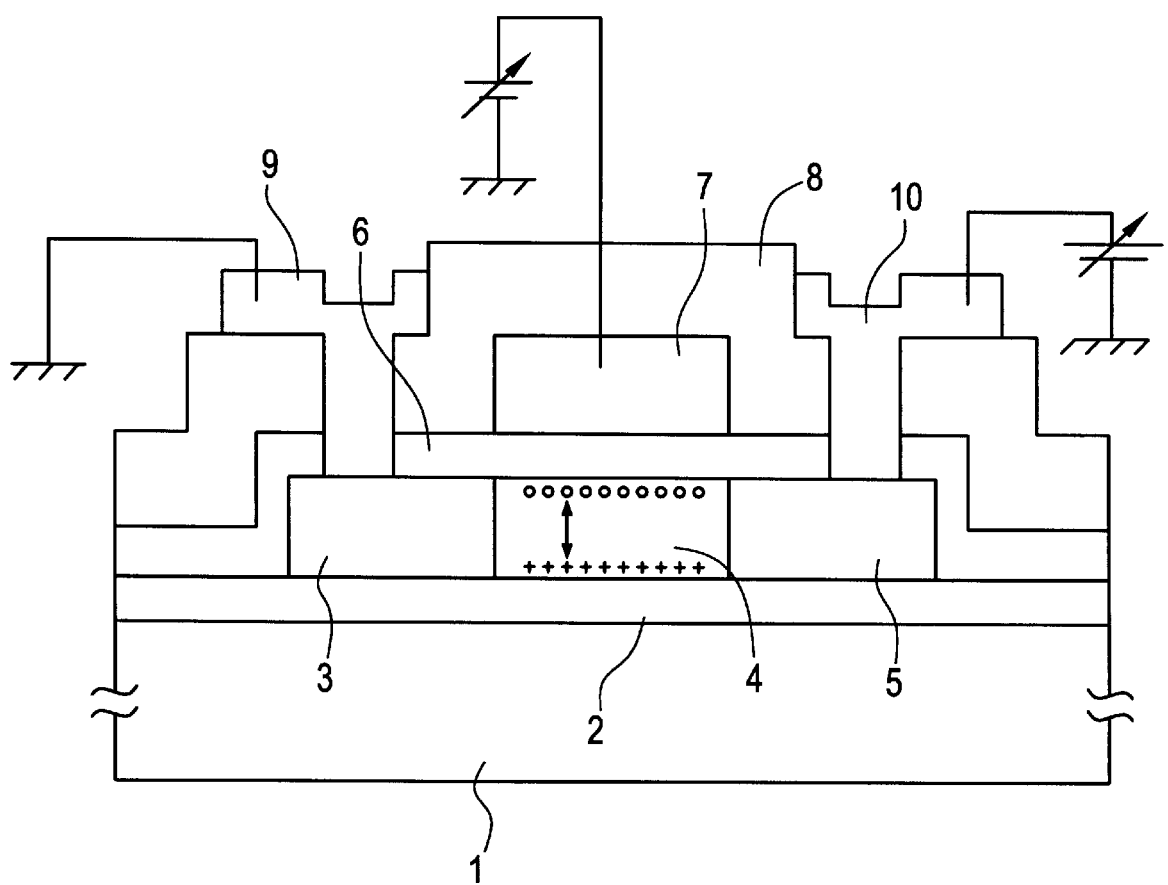
FIG. 1 is a schematic drawing of a cross section of the structure of an image sensor according to an embodiment of the present invention.
Figure 2:
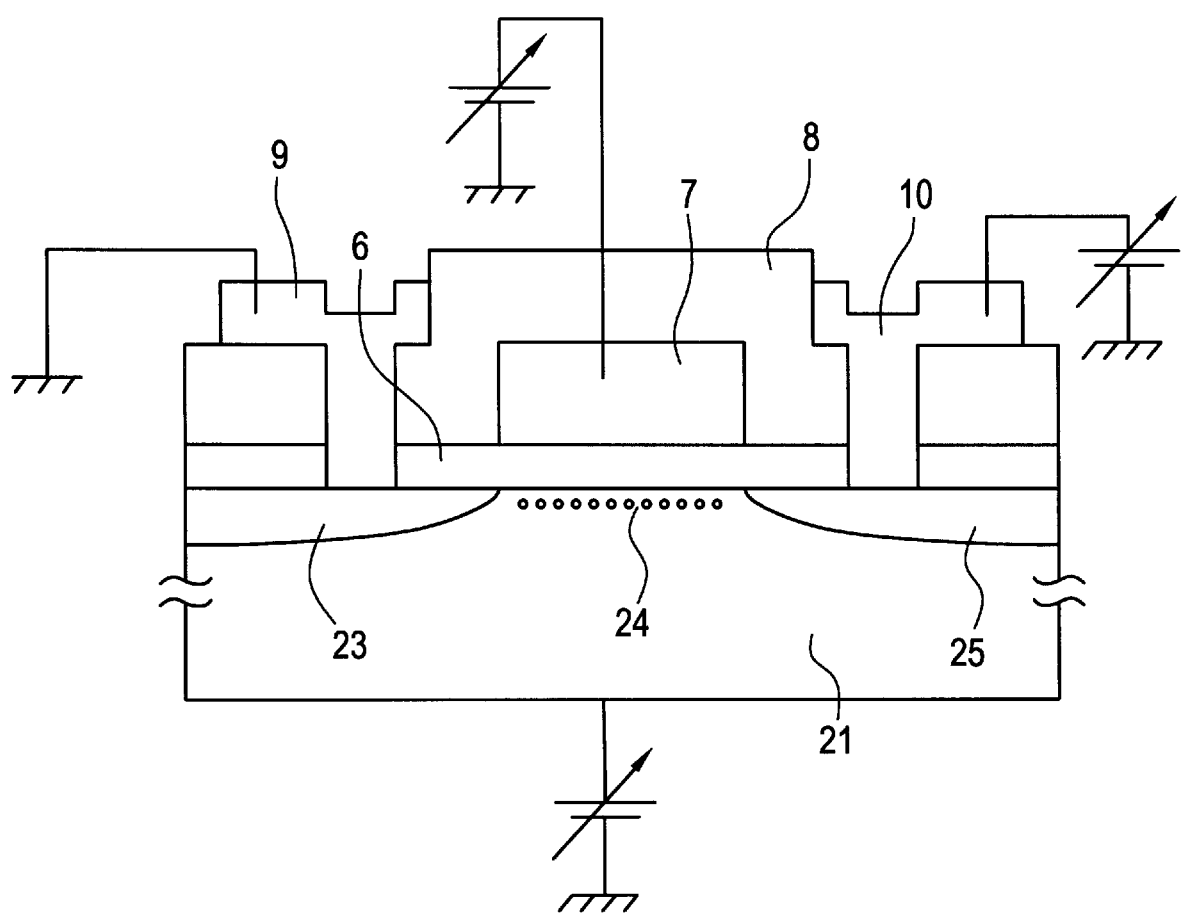
FIG. 2 is a schematic drawing of a cross section of the structure of an MOS transistor fabricated on a single crystal silicon wafer; illustrating the principles of the present invention FIGS. 3 (A) to 3 (F) are a diagram showing sequential steps for fabricating a semiconductor device according to an embodiment of the present invention.

The above deposited amorphous silicon film 43 is then The silicon film 43 thus obtained provides the silicon active layer 4 illustrated in numeric 4 in FIG. 1. The silicon film 43 must be provided with an appropriate thickness because excessively thin silicon film readily allows silicon atoms to diffuse into aluminum interconnection (to be described hereinafter) at the contact portion to cause contact failure or disconnection. More specifically, a silicon film 43 having thickness of less than 30 nm greatly impairs the product yield and reliability.

However, if the silicon film 43 is provided at a thickness of more than 1 μm, it becomes difficult to control the stress within the film. Thus, excessive thickness of a silicon film results in the formation of microcracks and defects. Such defective films cause problems concerning fluctuation in electric characteristics and poor reliability of the product elements.

Consequently, a silicon film 43 is preferred to be provided at a thickness of from 30 nm to 1 μm.

The crystalline silicon film 43 thus obtained is then patterned into an island-like structure, and a silicon oxide film 44 is deposited thereon to a thickness of 100 nm by LPCVD process. The silicon oxide film 44 is removed thereafter except for the image sensor element portion provided on the left hand side of the figure. Thus, the silicon oxide film 44 is provided as a gate insulating film for the image sensor element portion (FIG. 3 (B)).

Subsequently, a silicon oxide film 45 constituting the gate insulating film of the driver circuit portion for reading out the signal is formed by thermal oxidation. The silicon oxide film is provided at a thickness of 100 nm. The gate insulating film 44' of the image sensor element portion is thus formed from a silicon oxide film 44 previously deposited and the thermally oxidized silicon oxide film formed in the present step.

Thus, the gate insulating film of the image sensor element portion comprises a laminate of a 100 nm thick silicon oxide film deposited by LPCVD and a 100 nm thick silicon oxide film formed by thermal oxidation. The silicon oxide film formed by thermal oxidation constitutes the gate insulating film of the driver circuit portion for reading out the signal.

The electric characteristics of each of the gate insulating films for the image sensor element portion and the driver circuit portion can be set optimally by thus providing each of them with specified silicon oxide films.

The maximum thickness of a silicon oxide film used as the gate insulating film is preferably about 300 nm. If a gate insulating film having 300 nm or more in thickness is provided, a sufficient amplification effect cannot be obtained therefrom. Further, the minimum thickness of the silicon oxide film, on the other hand, is 20 nm. Concerning that a driving voltage of from 5 to 20V is applied to an image sensor element (a photoelectric transfer element provided in the left hand side of the figure in this case), and taking the fluctuation in film quality and long-term reliability into consideration, it is concluded that a silicon oxide film having 20 nm or more in thickness is required for a gate insulating film.

In the present example, the gate insulating film is separately provided in accordance with the characteristics required for the image sensor element portion and the driver circuit portion. However, if required characteristics is obtainable by a single gate insulating film provided at the same thickness, the use of such a gate insulating film provided at the same thickness is advantageous from the viewpoint of fabrication process.

The gate insulating film of the driver circuit portion of the semiconductor device of the present example is made from a thermally oxidized silicon film alone while that for the image sensor element portion partly comprises the thermally oxidized film. Preferred electric characteristics and long-term reliability can be obtained by the use of a thermally oxidized silicon film.

The present inventors have found out by experimentation that the electric characteristics of a MIS transistor greatly differ depending on whether a thermal oxidation process is used or not. In the graph of FIG. 5, an I-V characteristics of an MIS transistor using a thermally oxidized silicon film as the gate insulating film is shown with curve marked with (A), whereas that of an MIS transistor using a silicon film deposited by CVD process as the gate insulating film is shown with a curve marked with (B). FIG. 5 clearly shows that the threshold voltage is lower and that a higher ON/OFF ratio is obtained for the case using a thermally oxidized silicon film. It is also found out that the superior electric characteristics are retained for a long term by employing the thermally oxidized silicon film as the gate insulating film. In conclusion, a thermally oxidized film is superior concerning long-term reliability.

After forming the gate insulating films 44' and 45, an N+ type conductive polycrystalline silicon film 46 is deposited to a thickness of 300 nm by LPCVD process as the gate electrode. The film is doped with phosphorus at a dose of about $1 \times 10^{20}$ atoms/cm$^2$ or more (FIG. 3 (D)).

Next, the polycrystalline silicon film 46 is patterned thereafter by dry etching. Subsequently, a part of the upper side of each of the silicon oxide films 44' and 45 constituting the gate insulating film is removed by etching.

Thus are obtained gate electrodes 47, 48, and 49 from a polycrystalline silicon film 46. An impurity for rendering the structure N-type conductive, i.e., phosphorus, is implanted by either means of ion implantation or ion doping at a dose of $1 \times 10^{15}$ atoms/cm$^2$ by applying an accelerating voltage of 70 kV.

After covering the portions to which no impurities for rendering the regions P-type conductive are to be incorporated with a resist 50, boron ions are implanted at a dose of $5 \times 10^{15}$ atoms/cm$^2$ (FIG. 3 (F)).

Referring to FIG. 3 (F), the two elements on the right hand side only are implanted with boron ions.

The resulting structure is then subjected to thermal annealing at 600° C. for a duration of 12 hours under a nitrogen atmosphere to activate the thus incorporated impurities.

Then, a silicon oxide film is deposited to a thickness of 800 nm by means of normal pressure CVD process to form an interlayer insulating film 51 (FIG. 4 (A)).

The interlayer insulating film may be a PSG (phosphosilicate glass) film. Contact holes are then perforated (FIG. 4 (B)).

After depositing an aluminum film 52 by sputtering, the film is patterned to form an aluminum interconnection (FIGS. 4 (C) and 4 (D)).

The electric characteristics of the resulting device is improved by subjecting the structure to annealing at 350° C. in a hydrogen atmosphere for a duration of 1 hour. In this manner, the image sensor element portion and the driver circuit portion for reading out the signal are completed simultaneously in the device.

The resulting image sensor element comprises a gate electrode 47, source and drain electrodes 53 and 55, source and drain regions 56 and 58, and a channel forming region 57. The two elements in the driver circuit portion for reading out the signal also comprise a similar constitution.

The electric characteristics of the image sensor element is shown by the I-V curve shown in FIG. 6 in which the change in drain current is related to that of the gate voltage upon applying a voltage between the source and the drain. Referring to FIG. 6, the curve marked with A represents the characteristic curve obtained without irradiating a light, that marked with B represents to the curve obtained by irradiating a light, and that marked with C shows the current difference between the case in which a light is irradiated and that in which a light is not irradiated.

By comparing the curves marked with A and B in FIG. 6, it can be readily understood that a great difference is observed depending on whether a light is irradiated or not.

Figure 7:
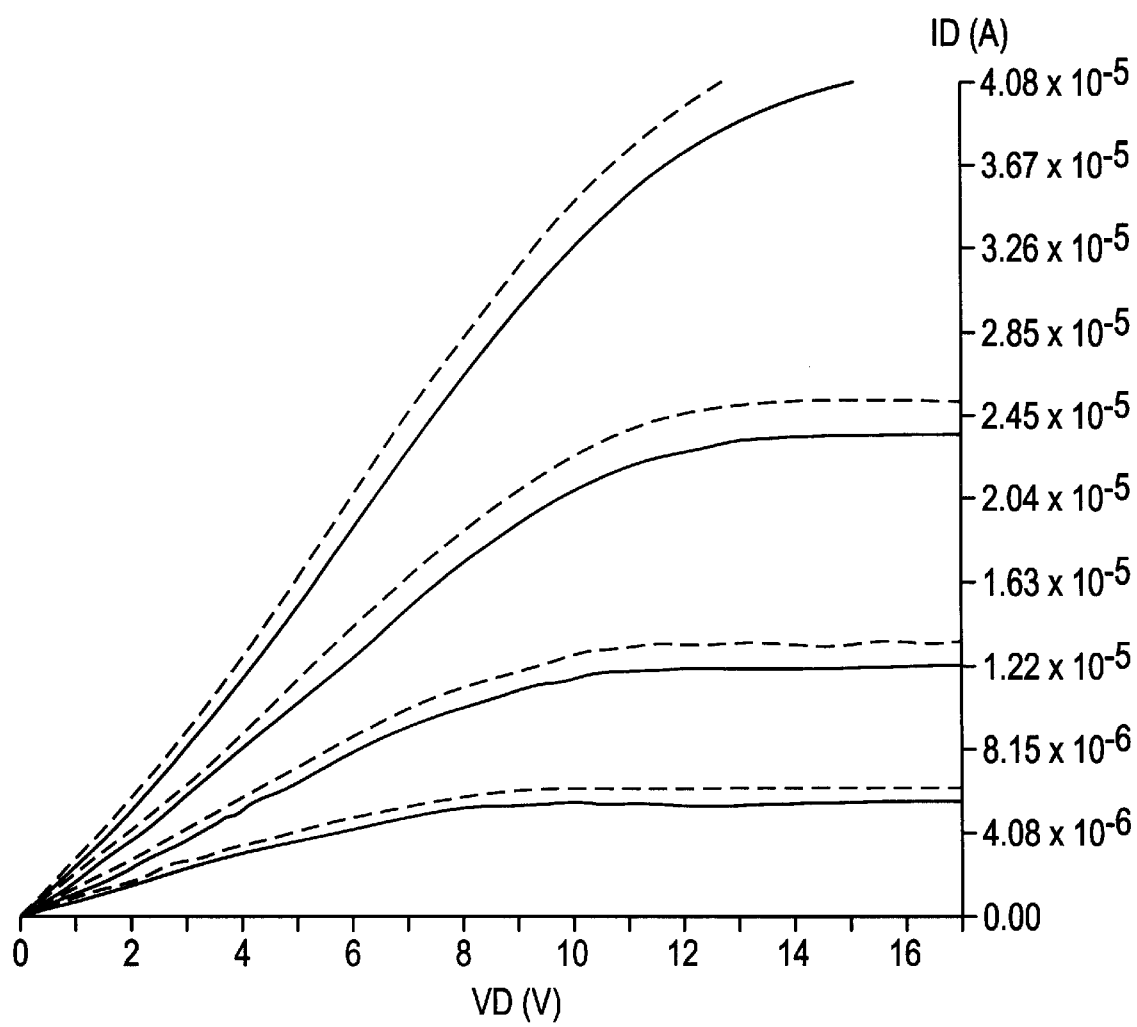
FIG. 7 shows the current-voltage ($I_D$-$V_D$) characteristics of a semiconductor device according to a still another embodiment of the present invention.

FIG. 7 shows a graph in which the drain current is related to the drain voltage. Solid lines represent the case in which light is not irradiated, and broken lines represent the case in which light is irradiated.

Conclusively, a light irradiated at an intensity of about 700 Ix induces a change of from 5 to 10% in the current output.

The optical response of the element thus obtained is in the range of from about 100 $\mu$s to 1 ms. It is also known that the optical response is greatly influenced by the thickness of the active layer 43 (which corresponds to the thickness of the channel forming region). The change in optical response with increasing film thickness of the active layer is illustrated in the graph shown in FIG. 8.

Figure 8:
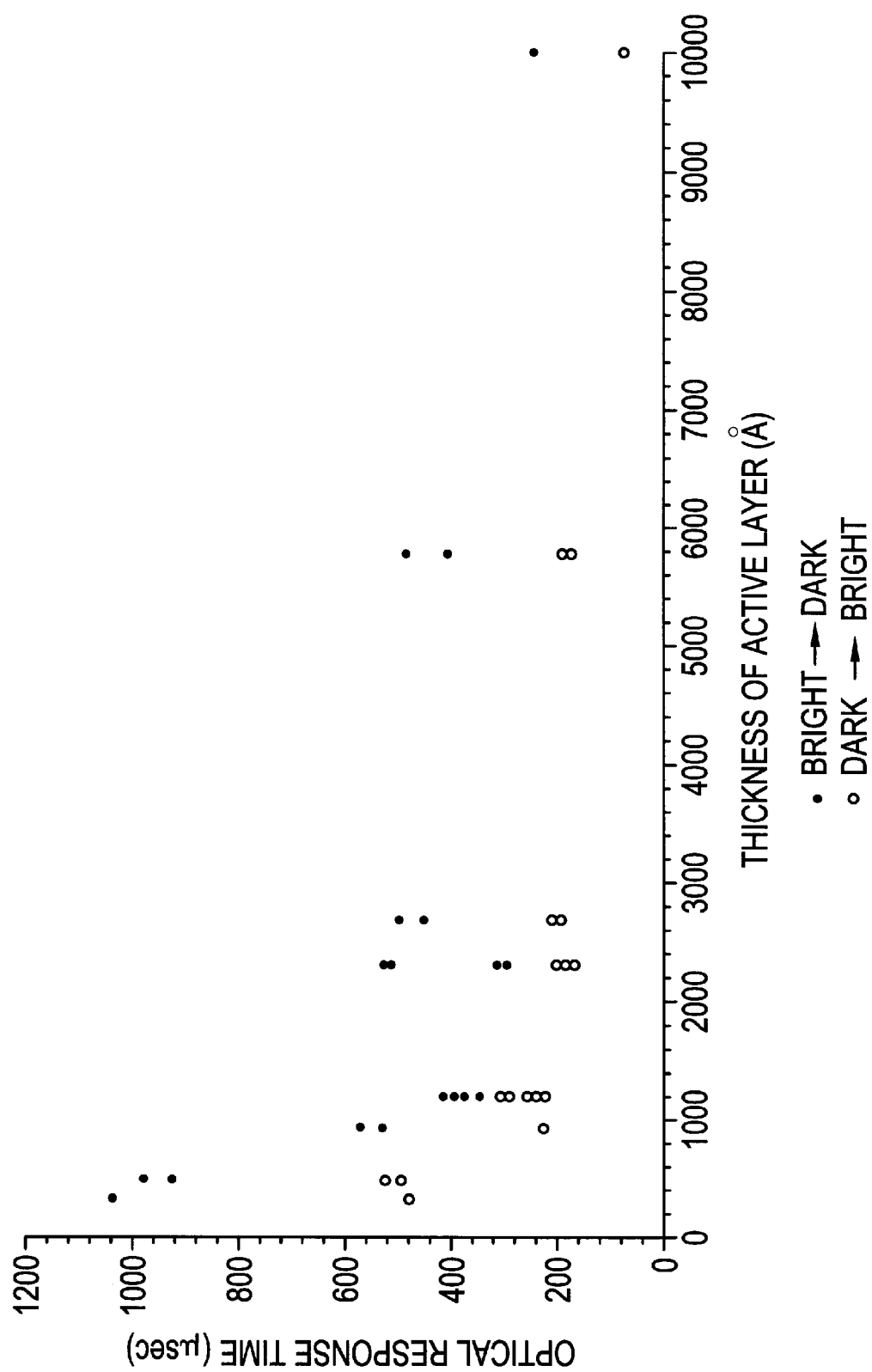
FIG. 8 shows the change in optical response of the semiconductor devices with increasing thickness of active layer.

Referring to FIG. 8, a quicker optical response is obtained with increasing thickness of the active layer 43. More specifically, a response in the range of from 200 to 400 $\mu$s is obtained for a case having an active layer 100 nm (1,000 Å) in thickness. Even in a case the thickness of the active layer is reduced to 50 nm (500 Å), a response of 1,000 $\mu$s or less is obtained.

Concerning that a G4 standard for a facsimile requires an optical response of 1 ms (1,000 $\mu$s) or less, an element having an active layer of 50 nm (500 Å) can be satisfactorily used in practice as determined from the above experimental result.

Further concerning that a G3 standard for a facsimile requires an optical response of 5 ms (5,000 $\mu$s), even an element having an active layer of about 30 nm is satisfactorily feasible for practical use as determined from the above experimental.

As described in the foregoing, the present invention provides an element comprising a thin film crystalline silicon as an active layer incorporated between insulating layers. By thus constructing an element of this specific structure, the photo carriers generated inside the active layer are efficiently captured in the layer. Thus, an element which amplifies a light signal irradiated to the active layer and outputs as a current between the source and drain can be obtained.

Thus, a device highly resistant of noise can be obtained since the device according to the present invention itself amplifies the light signal and allows a large current flow. Moreover, the device according to the present invention can be fabricated by utilizing a conventional TFT (thin film transistor) process at high productivity, because the driver circuits can be fabricated simultaneously with the photoelectric transfer element on a same substrate.

While the invention has been described in detail and with reference to specific embodiments thereof, it will be apparent to one skilled in the art that various changes and modifications can be made therein without departing from the spirit and scope thereof.

What is claimed is:

1. A semiconductor image sensor device comprising a plurality of thin film transistors provided on an insulating surface, wherein, a part of said plurality of thin film transistors comprises an image sensor element which outputs an electric signal in accordance with a light irradiated thereto, and another part of said plurality of thin film transistors comprises a driver element to drive said image sensor element, wherein said image sensor element and said driver element have respective active layers made from the same semiconductor film, wherein each of said plurality of thin film transistors includes a semiconductor island having an upper surface and side surfaces and a gate insulating film covering said upper surface and side surfaces of said semiconductor island, and wherein said gate insulating film of said part of the plurality of thin film transistor is thicker than said gate insulating film of said another part of the plurality of thin film transistor.

2. A device according to claim 1 wherein said insulating surface is a surface of an insulating substrate.

3. A device according to claim 1 wherein said insulating surface is a surface of an insulating film provided on a substrate.

4. A device according to claim 1 wherein the thin film transistor as said image sensor element comprises:

an active layer made from a crystalline silicon provided on said insulating surface; and a gate insulating film provided on said active layer.

5. A semiconductor image sensor device comprising:

a plurality of photo-sensitive thin film transistors on an insulated surface of a substrate; and a plurality of driving thin film transistors on the insulated surface for driving said photo-sensitive thin film transistors, each of said photo-sensitive thin film transistors and said driving thin film transistors comprising:

a semiconductor island formed on the insulated surface of the substrate, said semiconductor island having an upper surface and side surfaces;

a gate insulating film covering said upper surface and side surfaces of said semiconductor island;

a gate electrode formed on said gate insulating film, wherein a thickness of said gate insulating film of said photo-sensitive thin film transistors is thicker than a thickness of said driving thin film transistors.

6. A device according to claim 5 wherein said semiconductor island comprises crystalline silicon.

7. A device according to claim 5 wherein said gate insulating film comprises silicon oxide.

* * * * *

UNITED STATES PATENT AND TRADEMARK OFFICE
CERTIFICATE OF CORRECTION

PATENT NO. : 6,452,212 B1
DATED : September 17, 2002
INVENTOR(S) : Mitsufumi Codama et al.

It is certified that error appears in the above-identified patent and that said Letters Patent is hereby corrected as shown below:

<u>Title page,</u>
Item [73], Assignee, insert -- TDK Corporation --

Signed and Sealed this

Eighteenth Day of March, 2003

JAMES E. ROGAN
*Director of the United States Patent and Trademark Office*